(12) United States Patent
Akiyama et al.

(10) Patent No.: US 8,030,207 B2
(45) Date of Patent: Oct. 4, 2011

(54) METHOD OF MANUFACTURING A SEMICONDUCTOR DEVICE AND SEMICONDUCTOR DEVICE

(75) Inventors: Shinichi Akiyama, Kawasaki (JP); Kazuo Kawamura, Musashino (JP); Hisaya Sakai, Kawasaki (JP); Hirofumi Watatani, Kawasaki (JP); Kazuya Okubo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 382 days.

(21) Appl. No.: 12/110,662

(22) Filed: Apr. 28, 2008

(65) Prior Publication Data

US 2008/0284027 A1 Nov. 20, 2008

(30) Foreign Application Priority Data

Apr. 27, 2007 (JP) ................................. 2007-119144

(51) Int. Cl.
*H01L 21/4763* (2006.01)
*H01L 21/302* (2006.01)

(52) U.S. Cl. ........................................ 438/637; 438/720
(58) Field of Classification Search ................ 438/652, 438/653, 687, 637, 720, 727
See application file for complete search history.

(56) References Cited

U.S. PATENT DOCUMENTS

| 2002/0115287 A1* | 8/2002 | Hashim et al. | 438/653 |
| 2004/0127014 A1* | 7/2004 | Huang et al. | 438/627 |
| 2004/0152295 A1* | 8/2004 | Cooney et al. | 438/623 |
| 2005/0255691 A1* | 11/2005 | Ding et al. | 438/627 |
| 2008/0237029 A1* | 10/2008 | Tang et al. | 204/164 |

OTHER PUBLICATIONS

H. Sakai et al; "Novel PVD process of barrier metal for Cu interconnects extendable to 45nm node and beyond"; Advanced Metallization Conference AMC San Diego, Oct. 19, 2006; pp. 33-34.
G.S. Chen et al; "Phase formation behavior and diffusion barrier property of reactively sputtered tantalum-based thin films used in semiconductor metallization"; Thin Solid Films 353 (1999) pp. 264-273.

* cited by examiner

*Primary Examiner* — S. V Clark
(74) *Attorney, Agent, or Firm* — Westerman, Hattori, Daniels & Adrian, LLP

(57) ABSTRACT

A method of manufacturing a semiconductor device has forming, in a dielectric film, a first opening and a second opening located in the first opening, forming a first metal film containing a first metal over a whole surface, etching the first metal film at a bottom of the second opening using a sputtering process and forming a second metal film containing a second metal over the whole surface, and burying a conductive material in the second opening and the first opening.

10 Claims, 15 Drawing Sheets

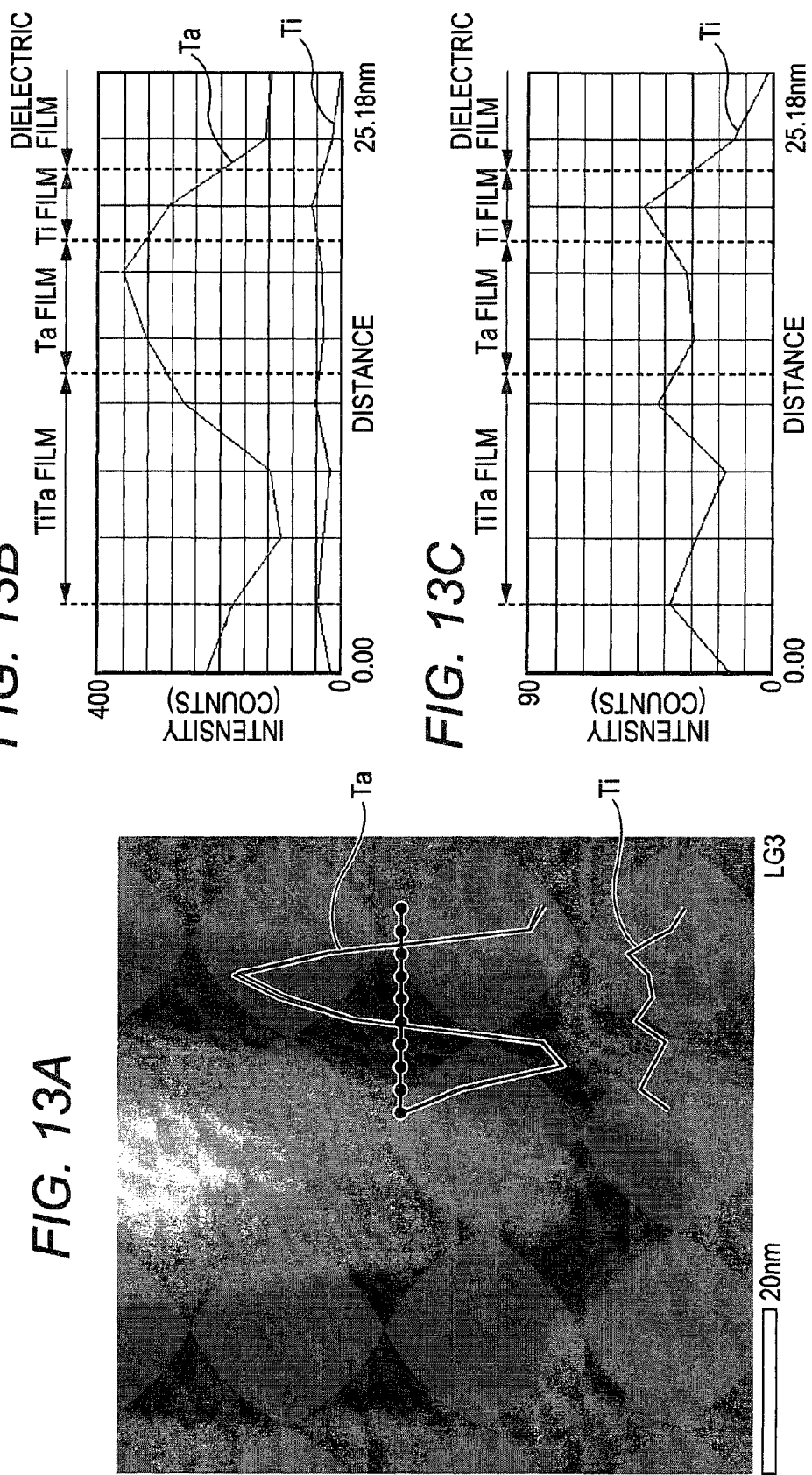

METHOD OF MANUFACTURING A SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2007-119144, filed on Apr. 27, 2007, the entire content of which is incorporated herein by reference.

BACKGROUND

The present invention relates to a method of manufacturing a semiconductor device and a semiconductor device.

In recent years, transistors are becoming increasingly finer and the number of transistors embedded in a semiconductor integrated circuit is increasing. In addition, a wire for connecting transistors is becoming longer and the delay of electrical signals passing through the wire is growing.

A multilayer wiring structure interconnecting upper wiring and lower wiring through a via hole is used. Low-resistance Cu is adopted as a metal wiring material. When forming a Cu wiring, a barrier layer to prevent diffusion of Cu needs to be formed between an interlayer dielectric film and the Cu wiring.

SUMMARY OF THE INVENTION

According to an aspect of the invention, a method of manufacturing a semiconductor device includes forming, in the dielectric film, a first opening and a second opening located in the first opening, forming a first metal film containing a first metal over a whole surface, etching the first metal film at a bottom of the second opening using a sputtering process and forming a second metal film containing a second metal over the whole surface, and burying a conductive material in the second opening and the first opening.

BRIEF DESCRIPTION OF THE DRAWINGS

FIGS. 13A to 13C are EDX analysis results.

PREFERRED EMBODIMENT

Embodiments of the present invention will be described in detail below with reference to the drawings. However, the technical scope of the present invention is not limited by these embodiments.

Figure 1A:
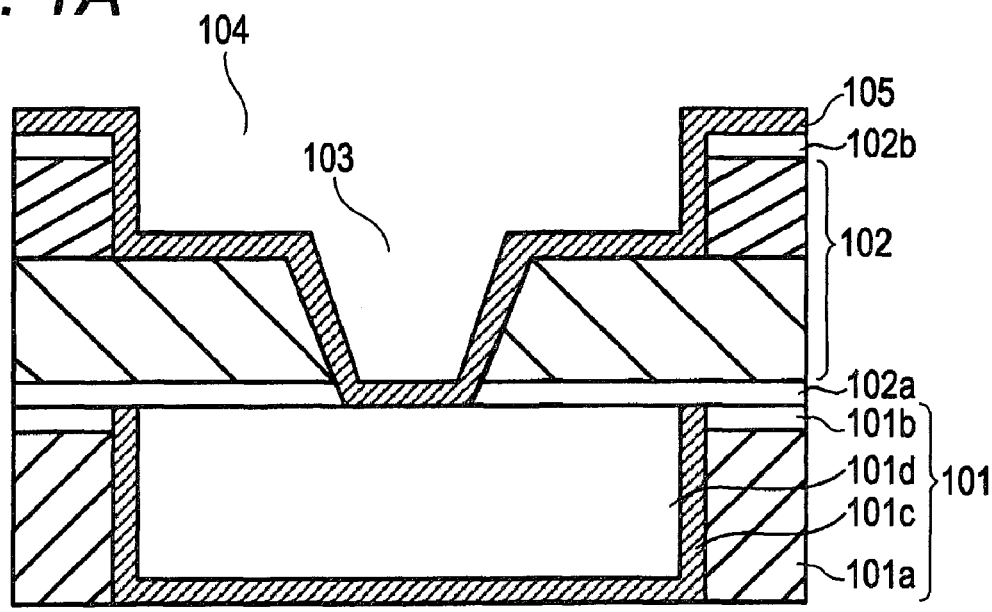
FIGS. 1A to 1E are views showing a process of sputter-etching the bottom of a via hole.

The embodiment uses a method of sputter-etching a barrier metal formed at the bottom of a via hole. First, sputter-etching of the bottom of the via hole will be described. In FIG. 1A, a tantalum film 101c is formed over an inner wall of a trench formed in a dielectric layer 101a. A Cu layer 101d is formed over the tantalum film 101c and the chemical mechanical polishing (CMP) method is used to form a wiring layer 101.

An interlayer dielectric film 102 is formed over the wiring layer 101 via a Cu barrier dielectric film 102a.

A hard mask film 102b is used to form a via hole 103 and a wiring groove 104 in the interlayer dielectric film 102.

A Ta film 105 is formed on the inner walls of the via hole 103 and the wiring groove 104 and over an upper surface of the hard mask film 102b as a barrier layer.

Figure 1B:
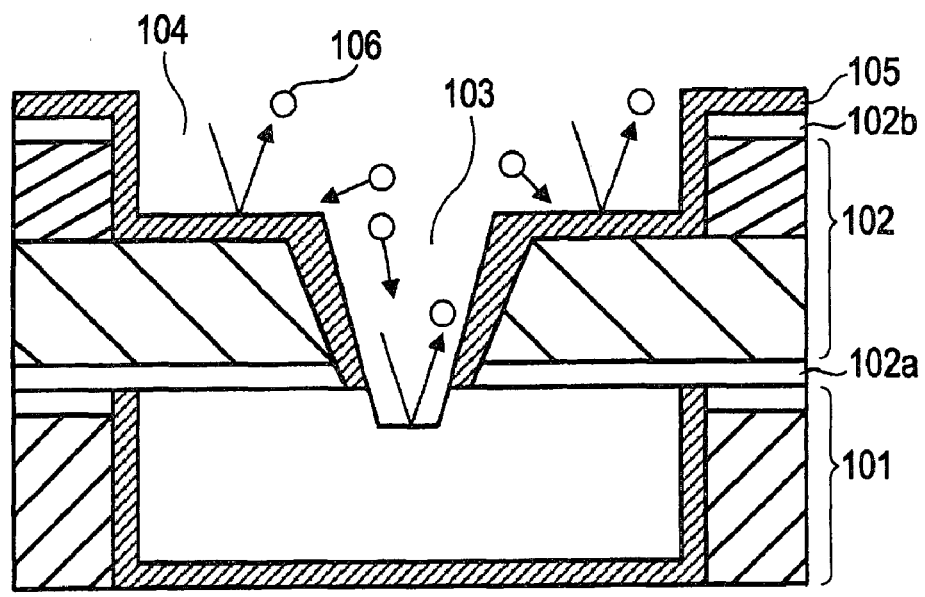

In FIG. 1B, in a Ta sputtering step, Ta is deposited over the whole surface and also Ta deposited at the bottom of the via hole 103 is etched by, for example, Ta ions 106 or argon ions. Ta ions sputtered from the bottom of the via hole 103 by etching adhere to sidewalls of the via hole 103 and the wiring groove 104. In the Ta sputtering step, a portion of the Cu layer 101d at the bottom of the via hole 103 may further be etched. The sputtering step is performed by setting the target power supply from 1 kW to 5 kW, the substrate bias from 200 W to 400 W, and a deposition rate Vd and an etching rate Ve of Ta over the hard mask film 102b so that the ratio (Vd/Ve) is Vd/Ve≦1, for example, Vd to 0.7 nm/sec and Ve to 0.9 nm/sec. Under these conditions, the Ta film 105 is intensively etched at the bottom of the via hole 103. The Ta film 105 formed in the via hole 103 is removed in order to suppress sheet resistance.

A portion of the Ta film 105 at the bottom of the via hole 103 may be left, instead of being completely removed by etching in the sputtering step. In this case, the thickness of the Ta film 105 at the bottom of the via hole 103 is thinner than that of the Ta film 105 at the bottom of the wiring groove 104. Here, Ar ions are taken as an example to be used for etching, but any gas that does not react with Ta, for example, He or Xe may also be used.

Figure 1C:
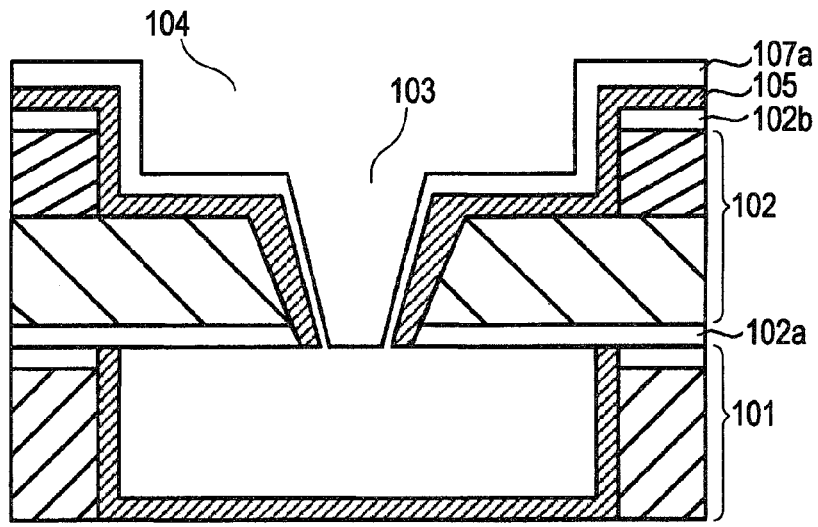

In FIG. 1C, after removing the Ta film 105 at the bottom of the via hole 103, a seed Cu film 107a is formed by using the sputtering process.

Figure 1D:
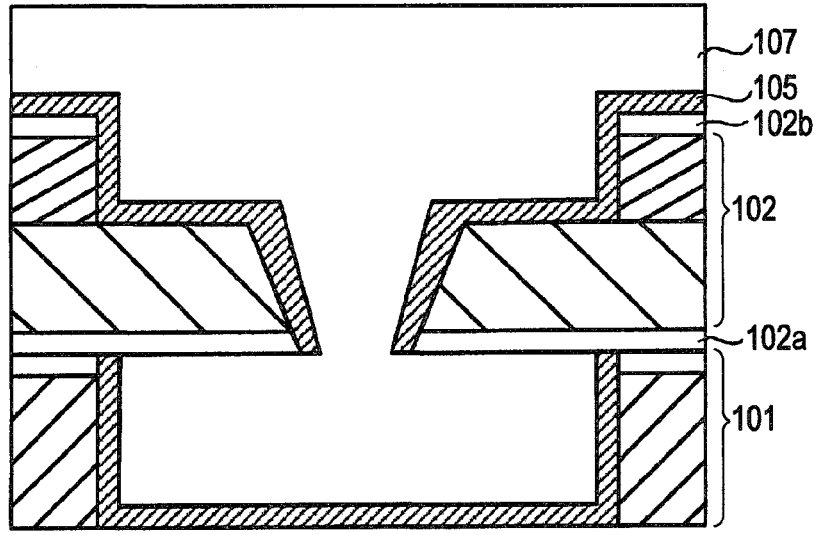

In FIG. 1D, a Cu layer 107 is formed over the seed Cu film 107a by using the electroplating method to bury the via hole 103 and the wiring groove 104.

Figure 1E:
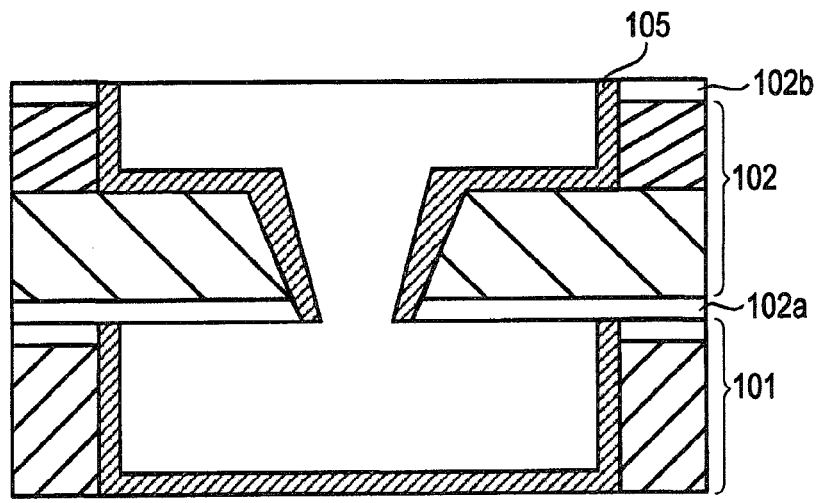

In FIG. 1E, the Cu layer 107 and the Ta film 105 over the hard mask film 102b are removed by using the CMP method.

A semiconductor device formed by the above methods was observed by using scanning transmission electron microscopy (STEM).

Figure 2:
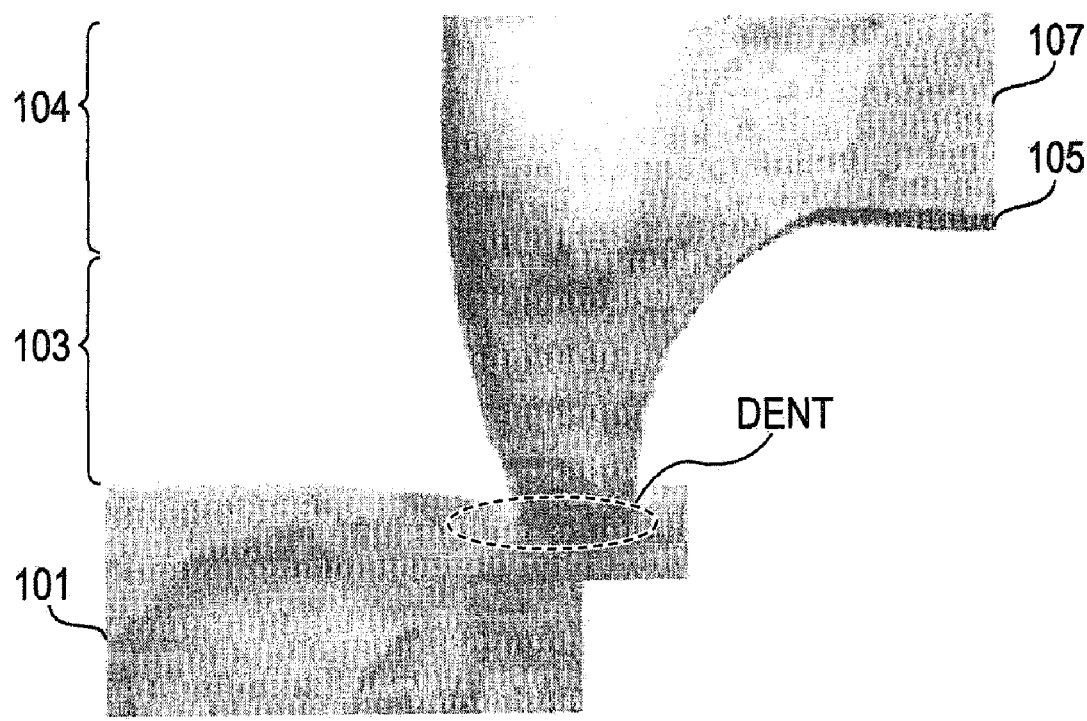
FIG. 2 is a section photograph of a device in which a wiring layer is formed.

FIG. 2 is an observation photograph by STEM of a section of the semiconductor device having a Cu multilayer wiring structure. The diameter of the via hole 103 is 100 nm and the width of the wiring groove 104 is 100 nm.

Since the Ta film 105 at the bottom of the via hole 103 and the wiring groove 104 has been etched by using the Ta ions 106, the thickness of the Ta film 105 at the bottom of the via hole 103 is thinner than that of the Ta film 105 formed at the bottom and at the sidewall of the wiring groove 104. The wiring layer 101 below the via hole 103 is also etched, generating a dent. When the Ta film 105 deposited at the bottom of the via hole 103 is etched, etched Ta atoms adhere to the sidewall of the via hole 103.

The results of performing X-ray diffraction (XRD) will be described.

Figure 3:
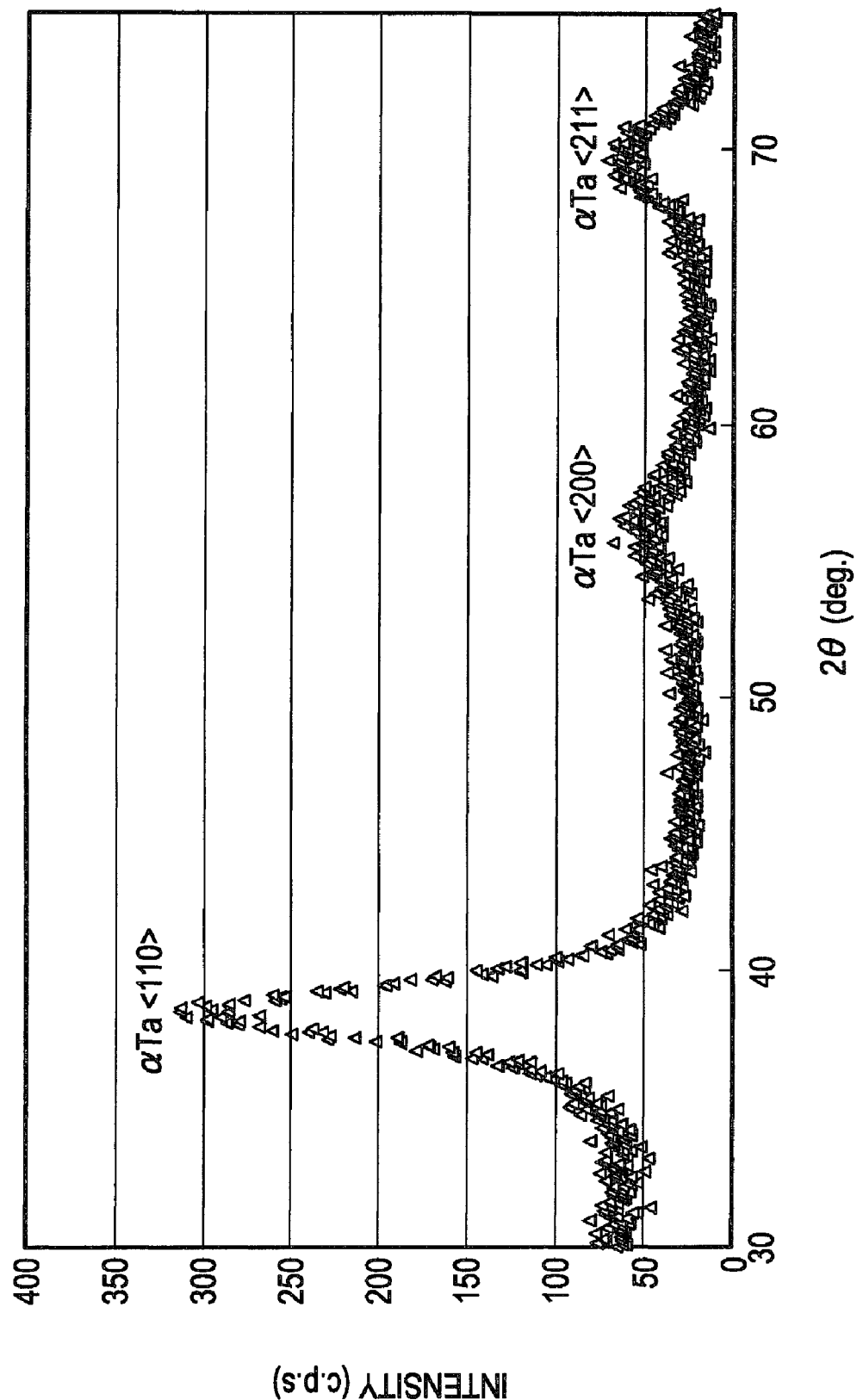
FIG. 3 is a graph showing XRD results of a tantalum layer.

FIG. 3 is a graph showing results of performing XRD on the tantalum layer of a semiconductor device formed according to the above methods.

It is evident from FIG. 3 that the Ta film 105 over the interlayer dielectric film 102 shows crystallinity and also the Ta film 105 is an $\alpha$ phase.

Figure 4A:
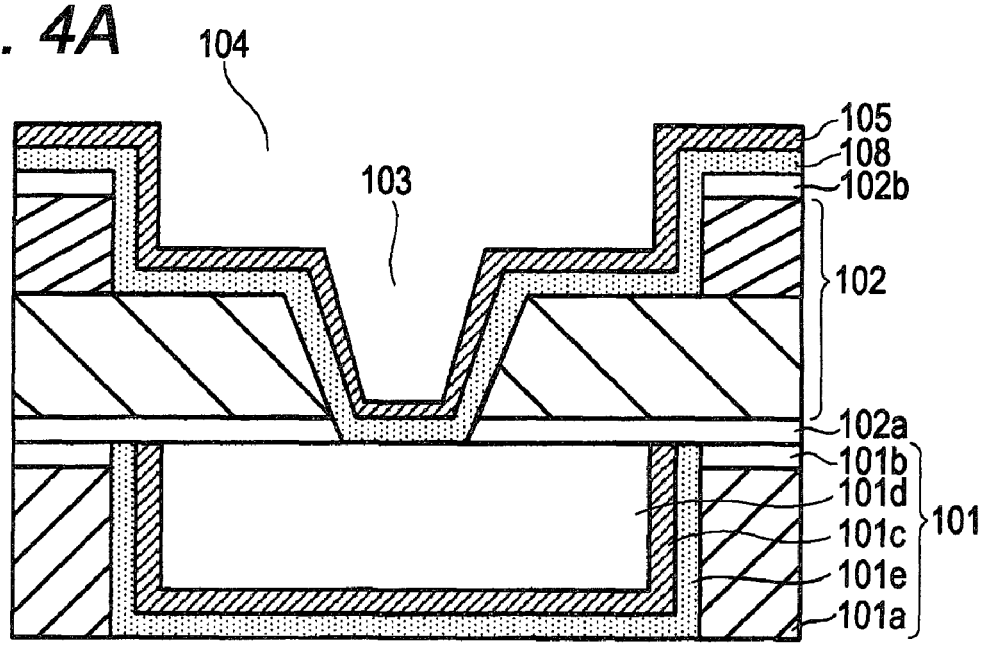
FIGS. 4A and 4B are sectional views showing a process of manufacturing a semiconductor device using a Ti film and a Ta film as barrier metals.
Figure 4B:
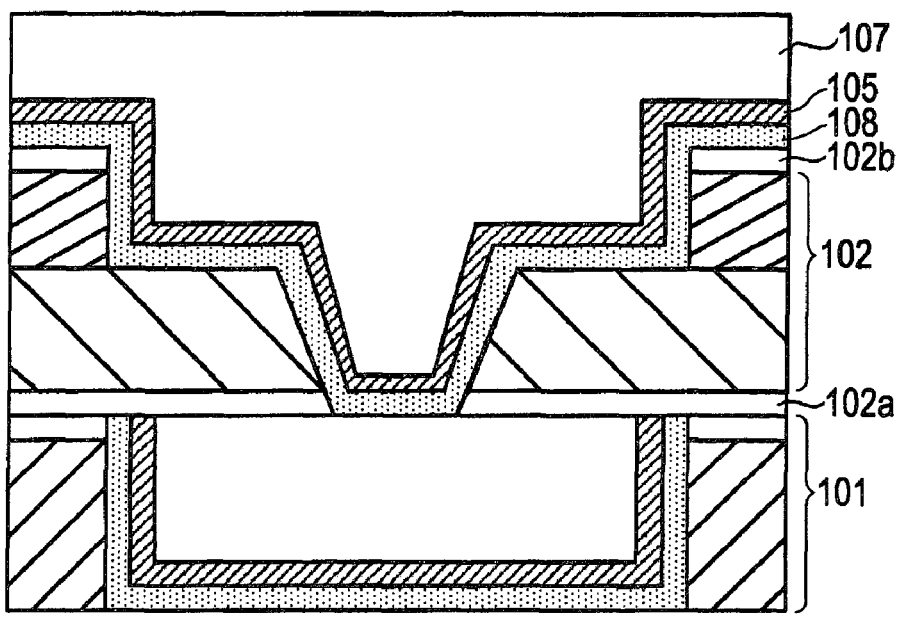

FIGS. 4A and 4B describe a process of forming wiring obtained by causing a Ti layer and a Ta layer to laminate in an opening of a via hole and a wiring groove formed in a dielectric film and burying Cu thereon.

In FIGS. 4A and 4B, the same reference numerals are attached to the same components as those in FIGS. 1A to 1E.

In FIG. 4A, the wiring layer 101 includes a Ti film 101e, a Ta film 101c, and a Cu layer 101d in a wiring groove formed in the dielectric layer 101a is formed. Here, the Ti film 101e improves adhesive properties between the Ta film 101c and the interlayer dielectric film 102. Reference numeral 101b is a hard mask.

The barrier dielectric film 102a and the interlayer dielectric film 102 is formed over the wiring layer 101.

The via hole 103 and the wiring groove 104 are formed in the interlayer dielectric film 102. Reference numeral 102b is a hard mask film.

A Ti film 108 is formed over the inner walls of the via hole 103 and the wiring groove 104 and over the upper surface of the hard mask film 102b. The long-throw sputtering process maybe used for the formation of the Ti film 108 under the conditions of the target power supply of 1 kW to 18 kW, the substrate bias of 0 W to 500 W, Vd of 2.0 nm/sec, and Ve of 0.3 nm/sec so that the thickness of the Ti film 108 is about 13 nm.

The Ta film 105 is formed over the Ti film 108. The long-throw sputtering process maybe used for the formation of the Ta film 105 under the conditions of the target power supply of 1 kW to 18 kW, the substrate bias of 0 W to 500 W, Vd of 1.4 nm/sec, and Ve of 0.8 nm/sec so that the thickness of the Ta film 105 is about 10 nm. The Ta film 105 is formed also at the bottom of the via hole 103 and the wiring groove 104.

In FIG. 4B, the Cu layer 107 is deposited over the Ta film 105 to bury the via hole 103 and the wiring groove 104.

The Cu layer 107, the Ti film 108, and the Ta film 105 over the hard mask film 102b are removed by using the CMP method.

Figure 5A:
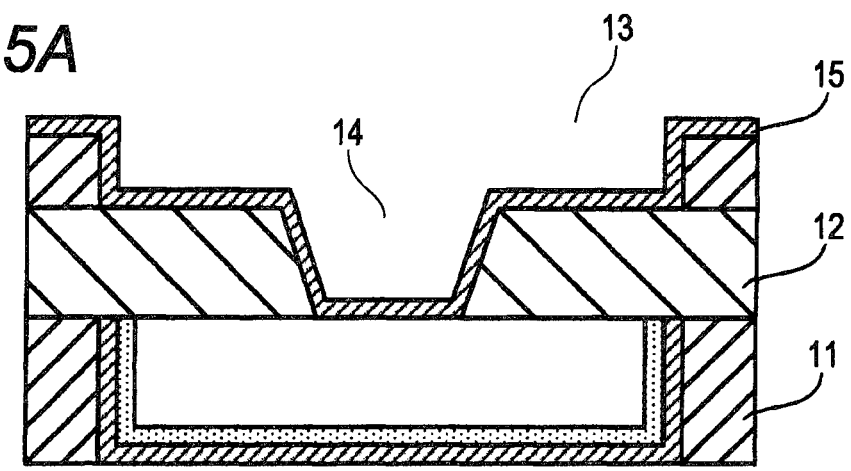
FIGS. 5A to 5C are views of a process of manufacturing a semiconductor device according to an embodiment of the present invention.
Figure 5B:
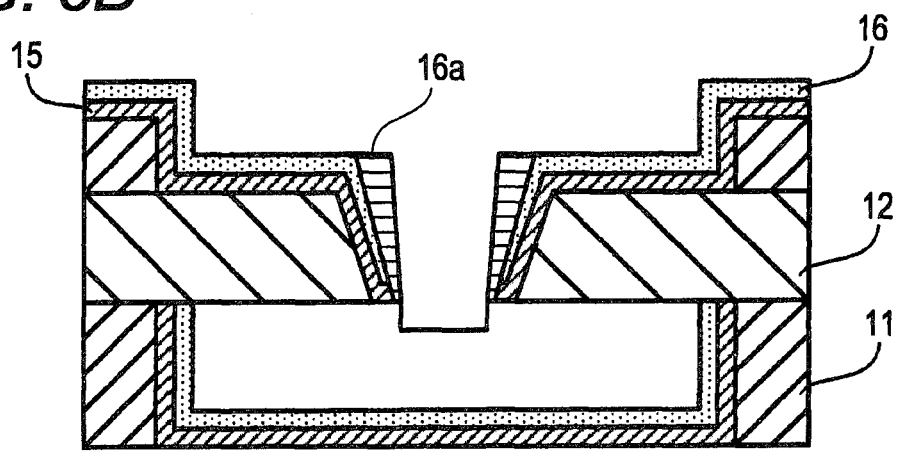
Figure 5C:
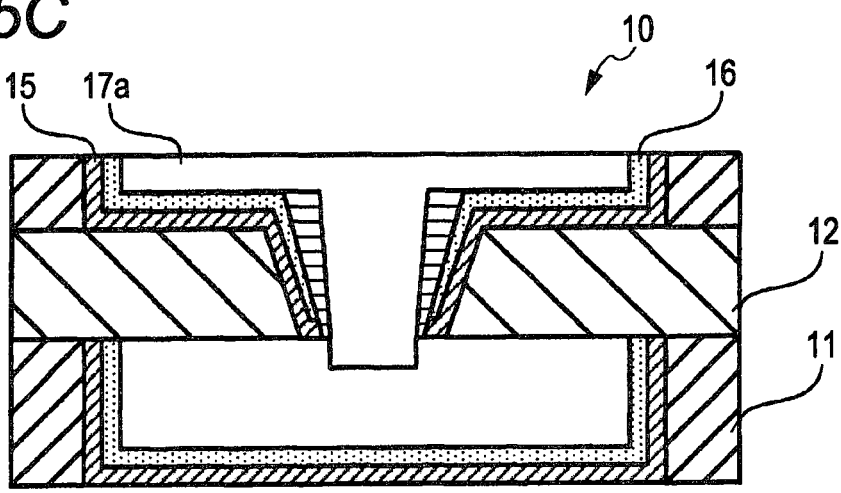

FIGS. 5A to 5C are sectional views of a method of manufacturing a semiconductor device in one embodiment of the present invention.

In FIG. 5A, a wiring layer 11 is formed by burying a conductive material in a dielectric film formed over a semiconductor substrate.

An interlayer dielectric film 12 is formed over the wiring layer 11. In the interlayer dielectric film 12, a wiring groove 13 and a via hole 14 in the wiring groove 13 reaching the wiring layer 11 are formed.

A Ti film, for example, is formed over the inner walls of the wiring groove 13 and the via hole 14 and on the surface of the interlayer dielectric film 12 as a first metal film 15.

In FIG. 5B, a Ta film, for example, is formed over the surface of the first metal film 15 as a second metal film 16, which is a barrier layer, by using the sputtering process, while etching the first metal film 15 at the bottom of the via hole 14.

In this step, an alloy layer 16a including a first metal element of the first metal film 15 and a second metal element of the second metal film 16. The first metal film 15 at the bottom of the via hole 14 may partially be removed, instead of removing the first metal film 15 completely.

In FIG. 5C, a conductive material 17a is deposited over the first and second metal films 15, 16. The metal films 15, 16 over the conductive material 17a are removed by the CMP method.

An alloy film of the sputtered first metal film 15 and second metal film 16 is formed over the sidewall of the via hole 14.

In the above manufacturing method, after forming the first metal film 15, the second metal film 16 was formed while etching the first metal film 15 at the bottom of the via hole 14. As a different method, after forming the second metal film 16 over the first metal film 15, the first metal film 15 and the second metal film 16 at the bottom of the via hole 14 may be etched. Also in this case, an alloy film is similarly formed at the sidewall of the via hole 14.

FIGS. 6A to 6E are sectional views of another method of manufacturing a semiconductor device.

Figure 6A:
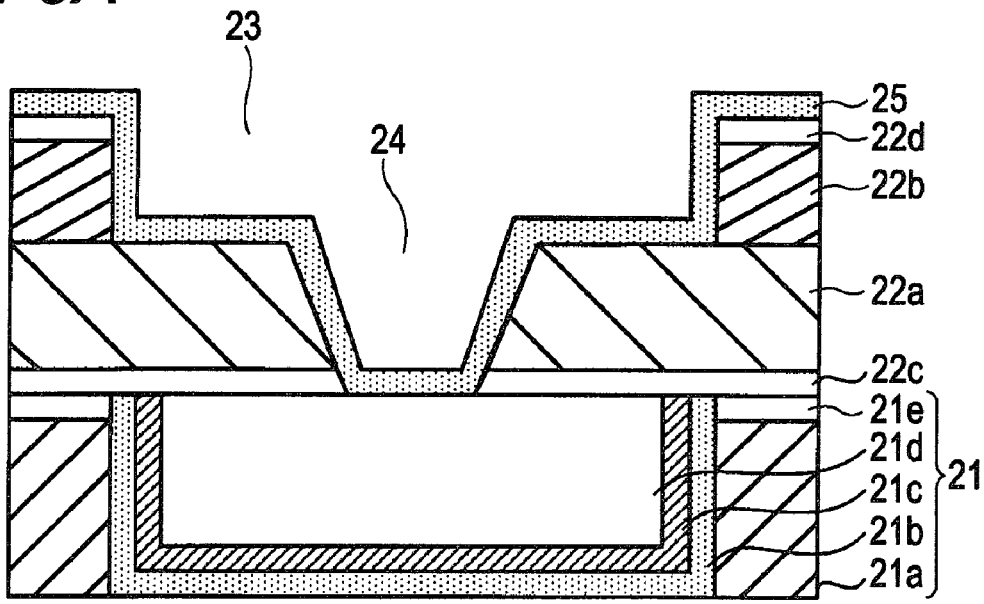
FIGS. 6A to 6E are views of a process of manufacturing a semiconductor device according to another embodiment of the present invention.

In FIG. 6A, wiring including a Ti film 21b, a Ta film 21c, and a Cu layer 21d is formed in a dielectric layer 21a.

A Cu barrier dielectric film 22c, an interlayer dielectric film 22a, an interlayer dielectric film 22b, and a hard mask film 22d are sequentially formed over a wiring layer 21.

A wiring groove 23 and a via hole 24 are formed in the interlayer dielectric film 22a and the interlayer dielectric film 22b. The interlayer dielectric film 22a and the interlayer dielectric film 22b may form different layers or a single layer made of the same material.

A Ti film 25 is formed over the inner wall of the wiring groove 23, over the inner wall of the via hole 24, and over the upper surface of the hard mask film 22d. The long-throw sputtering process, for example, maybe used for the formation of the Ti film 25 with a target power supply of 1 kW to 18 kW, a substrate bias of 0 W to 500 W, Vd of 2.0 nm/sec, and Ve of 0.3 nm/sec so that the Ti film 25 with a thickness of about 13 nm was formed over the hard mask film 22d.

Figure 6B:
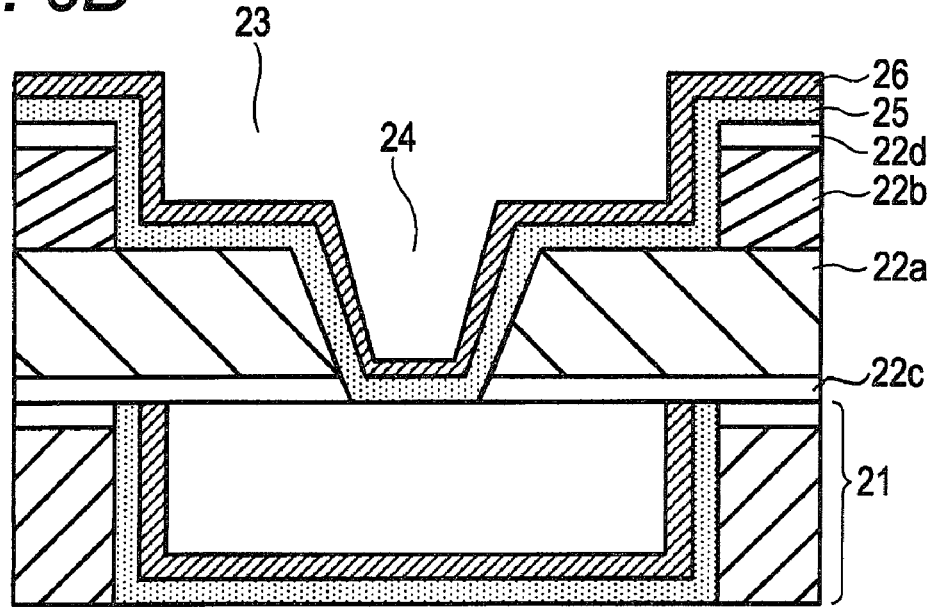

In FIG. 6B, a Ta film 26 is formed over the whole surface of the Ti film 25. The long-throw sputtering process, for example, maybe used for the formation of the Ta film 26 with a target power supply of 1 kW to 18 kW, a substrate bias of 0 W, Vd of 1.0 nm/sec in a region where a flat part, that is, where the wiring groove 23 was not formed, and Ve of 0 nm/sec so that the thickness of the Ta film 26 is about 10 nm.

Figure 6C:
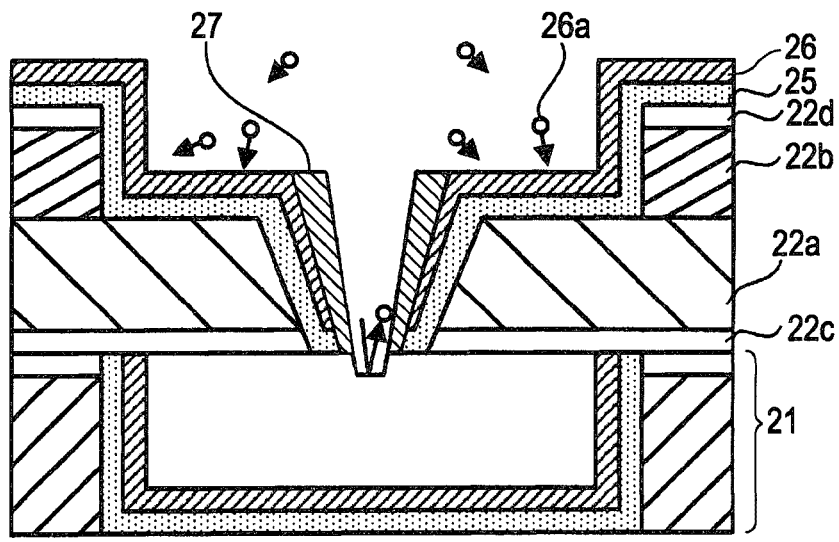

In FIG. 6C, a sputtering process with a Ta target is used to etch the Ti film 25 and the Ta film 26 is formed at the bottom of the via hole 24 using Ta ions 26a or Ar ions. Sputtering maybe performed, for example, with a target power supply of 1 kW to 5 kW, a substrate bias of 200 W to 400 W, Vd of 0.7 nm/sec in a region where a flat part, that is, where the wiring groove 23 was not formed, and Ve of 0.9 nm/sec, that is, Vd/Ve$\leq$1. The sputtering conditions change depending on the aspect ratio of the via hole 24 and other conditions, and the above sputtering conditions may be changed.

Under these conditions, sputter-etching is intensively performed at the bottom of the via hole 24, so that the Ti film 25 and the Ta film 26 formed at the bottom of the via hole 24 are etched. The Ta film 26 and the Ti film 25 sputtered from the bottom of the via hole 24 and the Ta ions 26a sputtered from the target are deposited onto the sidewall of the via hole 24 as an alloy film 27 of Ti and Ta.

As shown in FIG. 6C, the Ta film 26 is formed over the sidewall and at the bottom of the wiring groove 23 and over the sidewall of the via hole 24. Further, a Ti—Ta film 27 is formed over the Ta film 26 over the sidewall of the via hole 24.

Since the Ta film 26 is formed at the bottom and on the sidewall of the wiring groove 23, the Ti film 25 is not directly in contact with a Cu layer 29 formed later. Thus, the Ti element can be prevented from being diffused into the Cu layer 29 of metallic wiring.

A portion of the Ti film 25 formed at the bottom of the via hole 24 may be left, instead of being completely removed by etching at the bottom of the via hole 24. In this case, the thickness of the Ti film 25 at the bottom of the via hole 24 is thinner than that of the Ti film 25 at the bottom of the wiring groove 23.

Figure 6D:
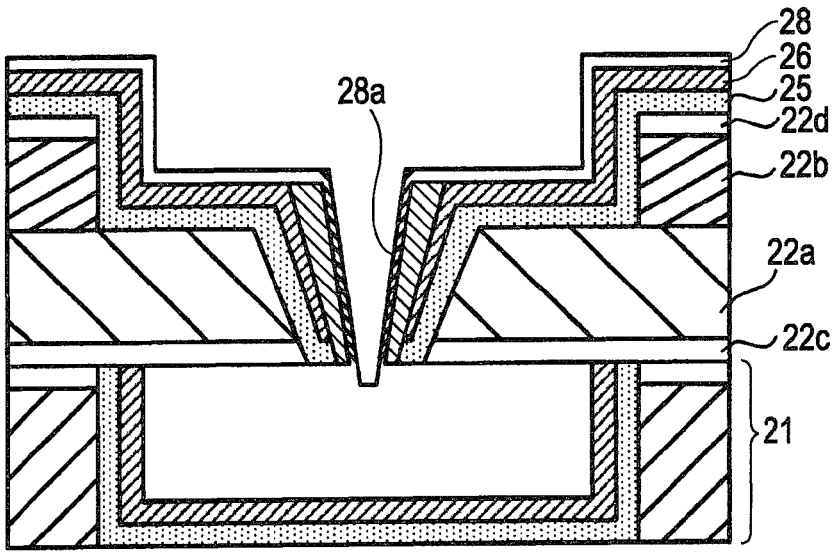

In FIG. 6D, a seed Cu film 28 is formed over the whole opening of the wiring groove 23 and the via hole 24 by using the sputtering process. At this time, the Ti—Ta film 27 is already formed over the sidewall of the via hole 24 and the Cu element of the seed Cu film 28 and the Ti element of the Ti—Ta film 27 may react, improving formation coverage of the seed Cu film 28.

Figure 6E:
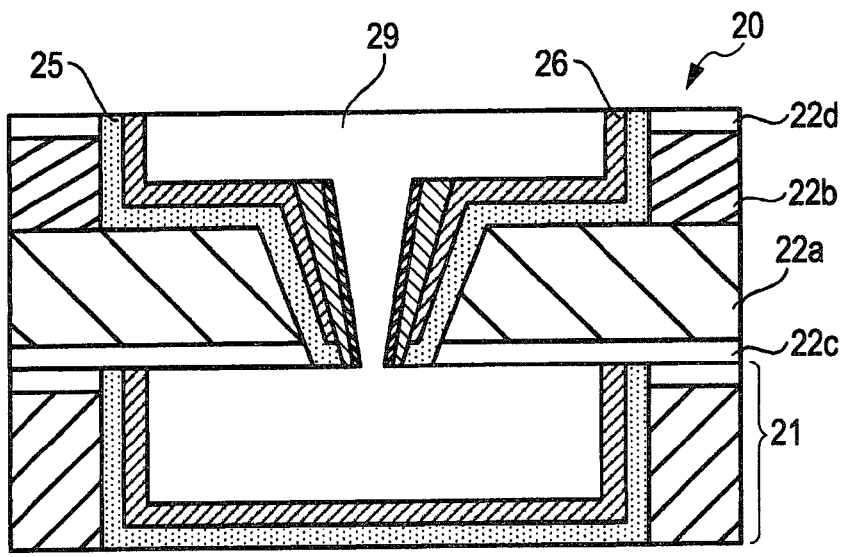

In FIG. 6E, the Cu layer 29 is deposited using the electroplating method to bury the via hole 24. Then the wiring groove 23, and the Cu layer 29, the Ta film 26, and the Ti film 25 over the hard mask film 22d are removed by using the CMP method.

The Ti—Ta film 27 can be formed over the Ta film 26 at the sidewall of the via hole 24, making formation of the seed Cu film 28 in the via hole 24 easier. Moreover, since the Ti—Ta film 27 can intensively be formed at the inner wall of the via hole 24, an increase in resistance of the Cu layer 29 due to diffusion of Ti into the Cu layer 29 formed inside the wiring groove 23 can be suppressed.

In the present embodiment, the Ta film 26 is formed over the Ti film 25, for example, up to 10 nm in thickness and then, the bottom of the via hole 24 is etched under the conditions of Vd/Ve≦1 using a Ta target. However, the bottom of the via hole 24 may be etched under the conditions of Vd/Ve≦1 using a Ta target without depositing the Ta film 26 onto the Ti film 25. Also in this case, the Ti—Ta film 27 can be deposited onto the sidewall of the via hole 24. In both the embodiments, after the bottom of the via hole 24 is etched, 3 nm to 7 nm, for example, 5 mm of the Ta film may be deposited by sputtering. This additional Ta film formation has a thickness about 20% of the thickness of the Ta film 26 formed at the sidewall and at the bottom of the wiring groove 23. Since the Ta film additionally deposited onto the sidewall of the via hole 24 is thin, an effect of improved Cu coverage by the Ti—Ta film 27 is not suppressed. The formation process of this additional Ta film may be applied to the embodiment described in FIGS. 5A to 5C.

Figure 7A:
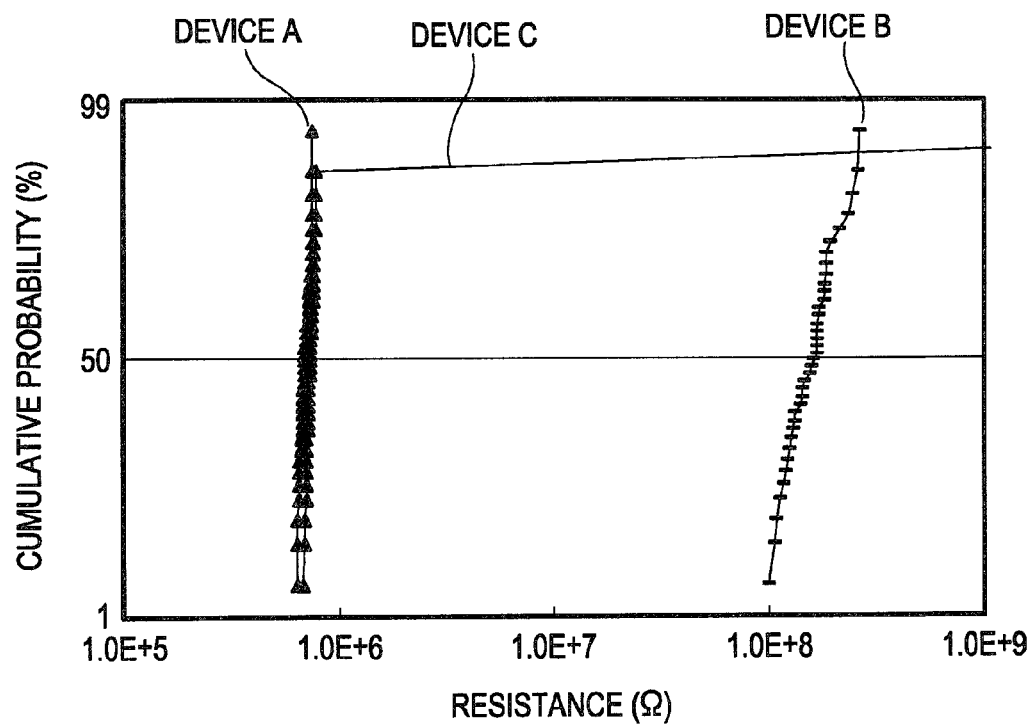
FIGS. 7A and 7B are graphs showing resistance values of Cu wirings.
Figure 7B:
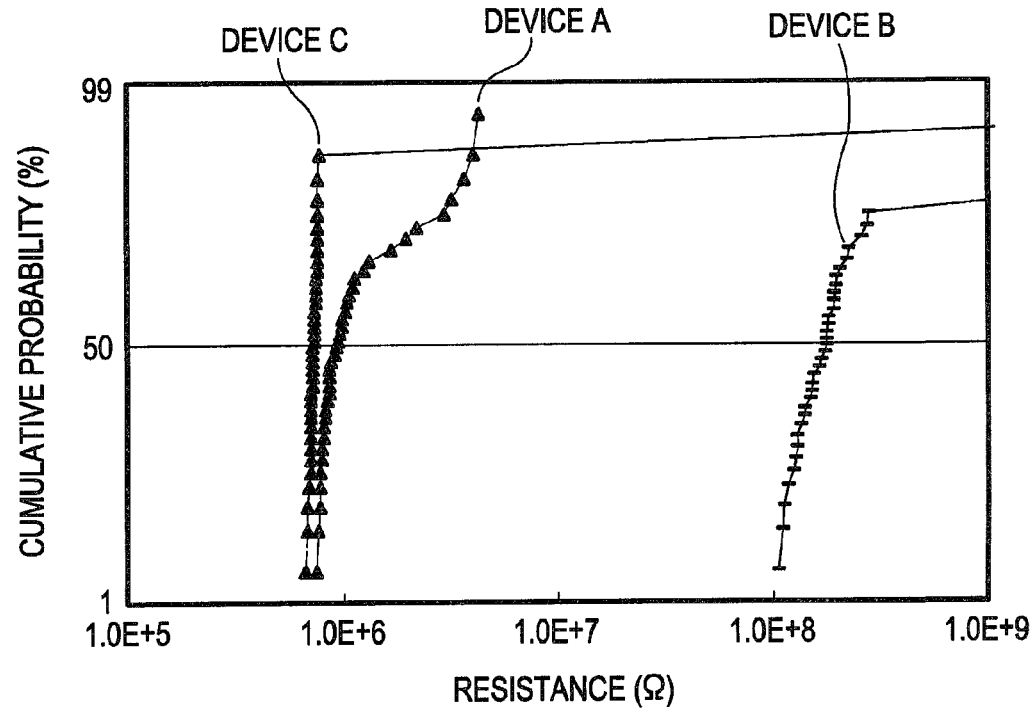

FIGS. 7A and 7B are graphs showing resistance values of a device A, which is a semiconductor device formed in the step shown in FIGS. 1A and 1B, a device B, which is a semiconductor device formed in the step shown in FIG. 4A, and a device C, which is a semiconductor device formed in the step shown in FIGS. 5A to 5C.

The horizontal axis in FIGS. 7A and 7B show the value of chain resistance [Ω] and the vertical axis in FIGS. 7A and 7B show the cumulative probability [%] with respect to the resistance value. FIG. 7A shows a case immediately after the above semiconductor manufacturing step is completed and FIG. 7B shows a case in which the devices are left alone for 400 hours to 600 hours in a high-temperature environment of 100° C. to 250° C. after the semiconductor manufacturing step is completed.

In FIG. 7A, the chain resistance of the device B is higher than that of the device A or the device C. On the other hand, FIG. 7A shows that the device A and the device C have stable chain resistance.

The chain resistance of the device A in FIG. 7B is higher than the chain resistance of the device A in FIG. 7A. The chain resistance of the device C showed lower values.

A semiconductor device 20 formed by a manufacturing method according to one of the above embodiments was observed using STEM.

Figure 8A:
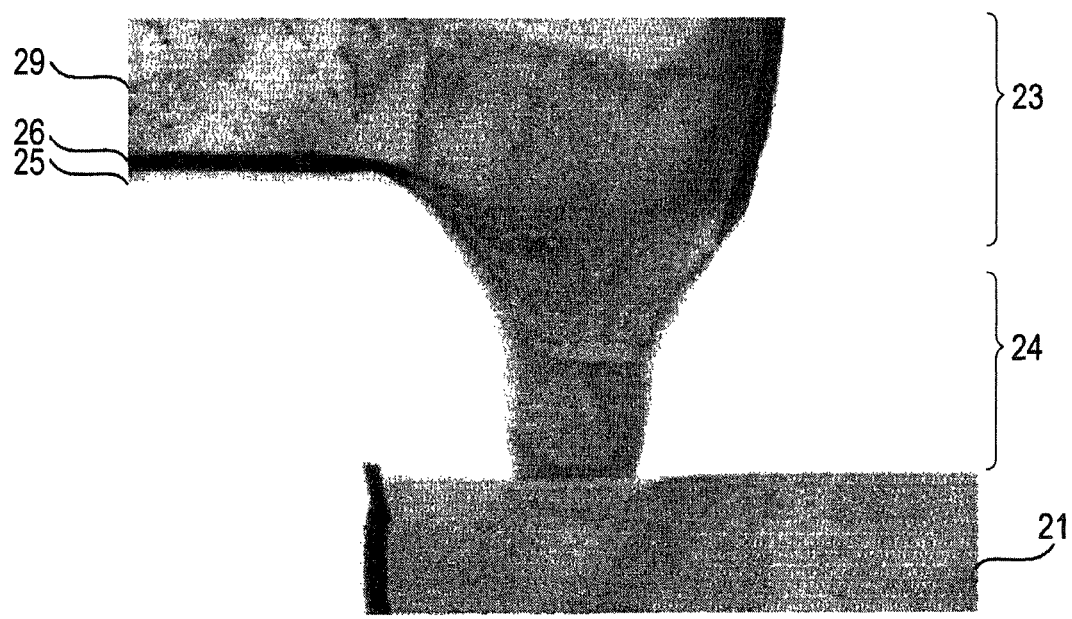
FIGS. 8A and 8B are STEM photographs of sections of the semiconductor devices of the present invention.
Figure 8B:
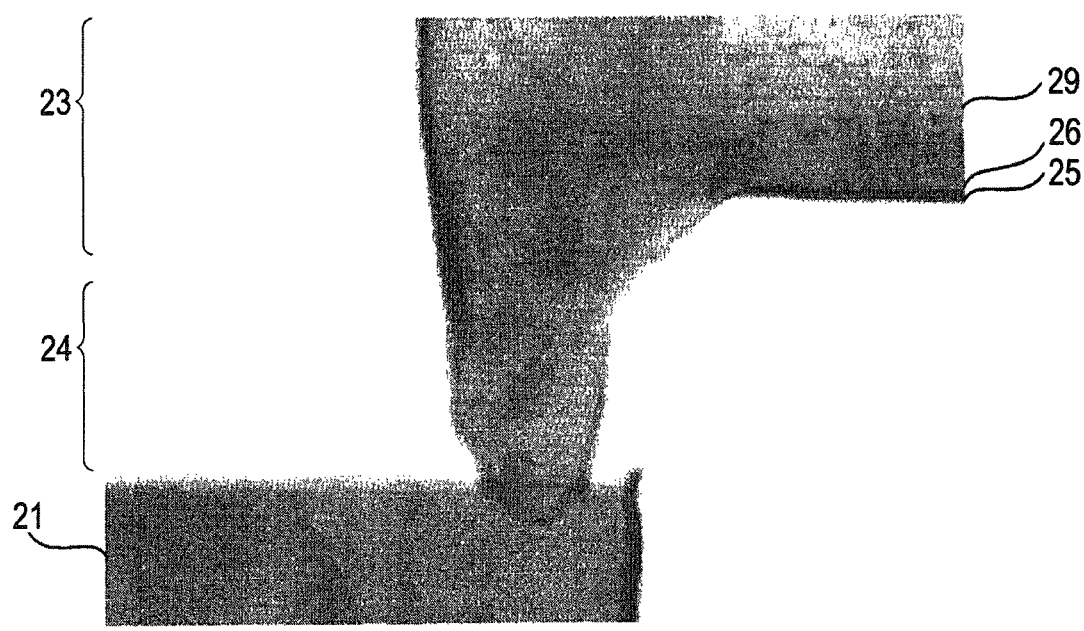

FIGS. 8A and 8B show observation photographs by STEM of a section of a semiconductor device according to an embodiment. The diameter of the via hole 24 is 100 nm and the width of the wiring groove 23 is about 100 nm. Further, FIG. 8A shows the formed Ti film 25 when the thickness thereof is about 13 nm and FIG. 8B shows the Ti film 25 when the thickness thereof is about 10 nm.

In FIG. 8A, the Ta film 26 and the Ti film 25 at the bottom of the via hole 24 are etched mainly by the Ta ions 26a and therefore, the thickness of the Ta film 26 at the bottom of the via hole 24 is thinner than that of the Ta film 26 at the bottom of the trench groove 23.

In FIG. 8B, on the other hand, the Ta film 26 similarly remains at the bottom of the via hole 24, but the bottom of the via hole 24 is more etched than when the Ti film 25 is 13 nm thick and the thickness of the Ta film 26 at the bottom of the via hole 24 is thinner than that of the Ta film 26 at the bottom of the trench groove 23.

The Ta film 26 is also formed at the bottom of the wiring groove 23.

Figure 9A:
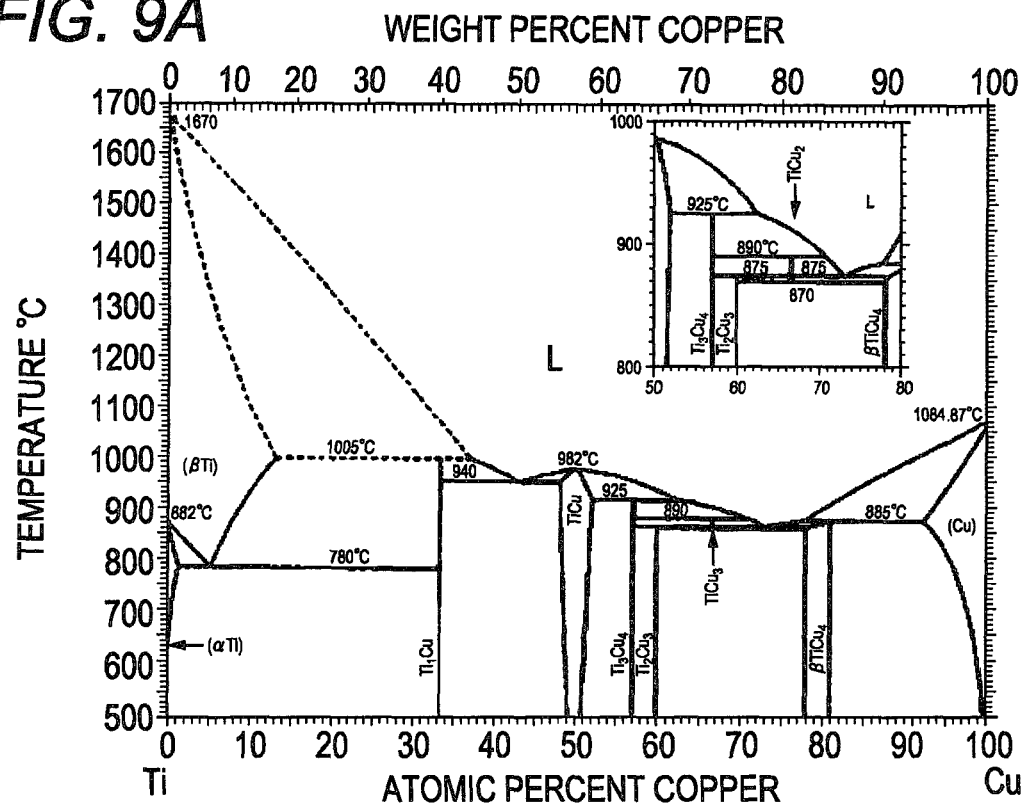
FIGS. 9A and 9B are phase diagrams of Cu and Ti, and Cu and Ta respectively.
Figure 9B:
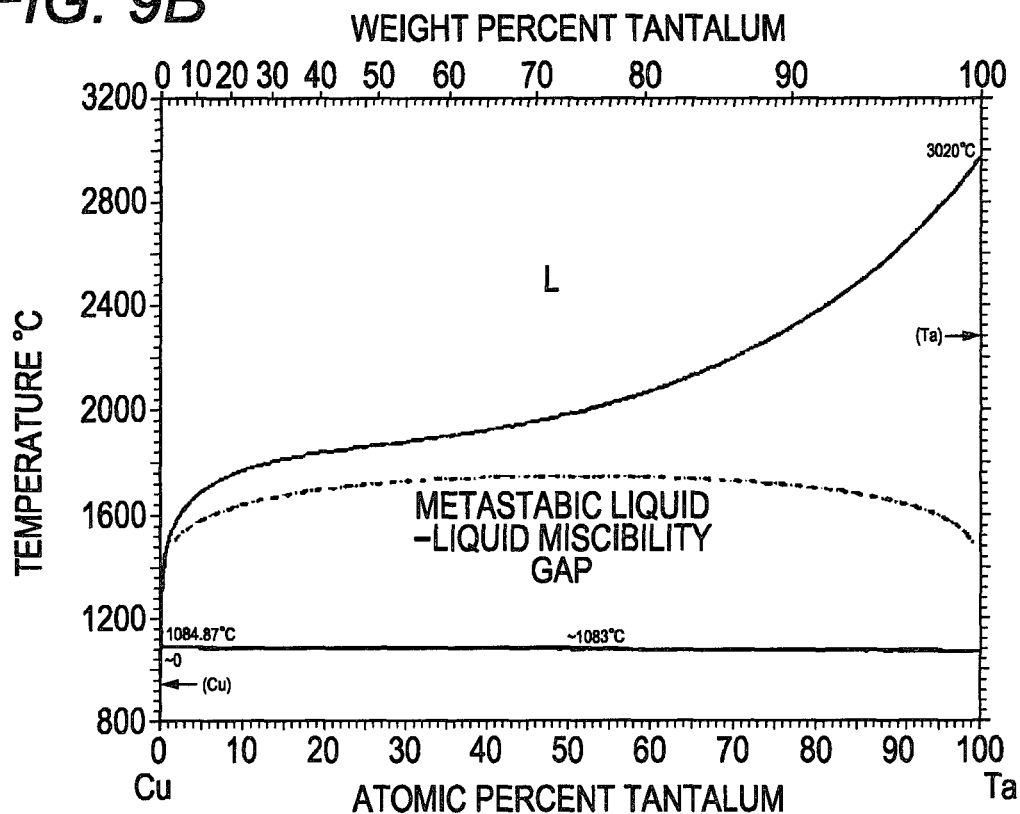

FIG. 9A is a phase diagram of Cu and Ti. FIG. 9A shows that Ti and Cu are likely to react. FIG. 9B is a phase diagram of Cu and Ta. FIG. 9B shows that Ta and Cu are unlikely to react.

Thus, if, for example, the seed Cu film 28 is formed so as to be in contact with the Ti film 25, the Ti element and the Cu element will react. When the Ti element and the Cu element react, the resistance of the Cu layer 29 increases. However, since the Ta film 26 is formed over the Ti film 25 in the present embodiment, diffusion of the Ti element into the Cu layer 29 is suppressed.

Figure 10:
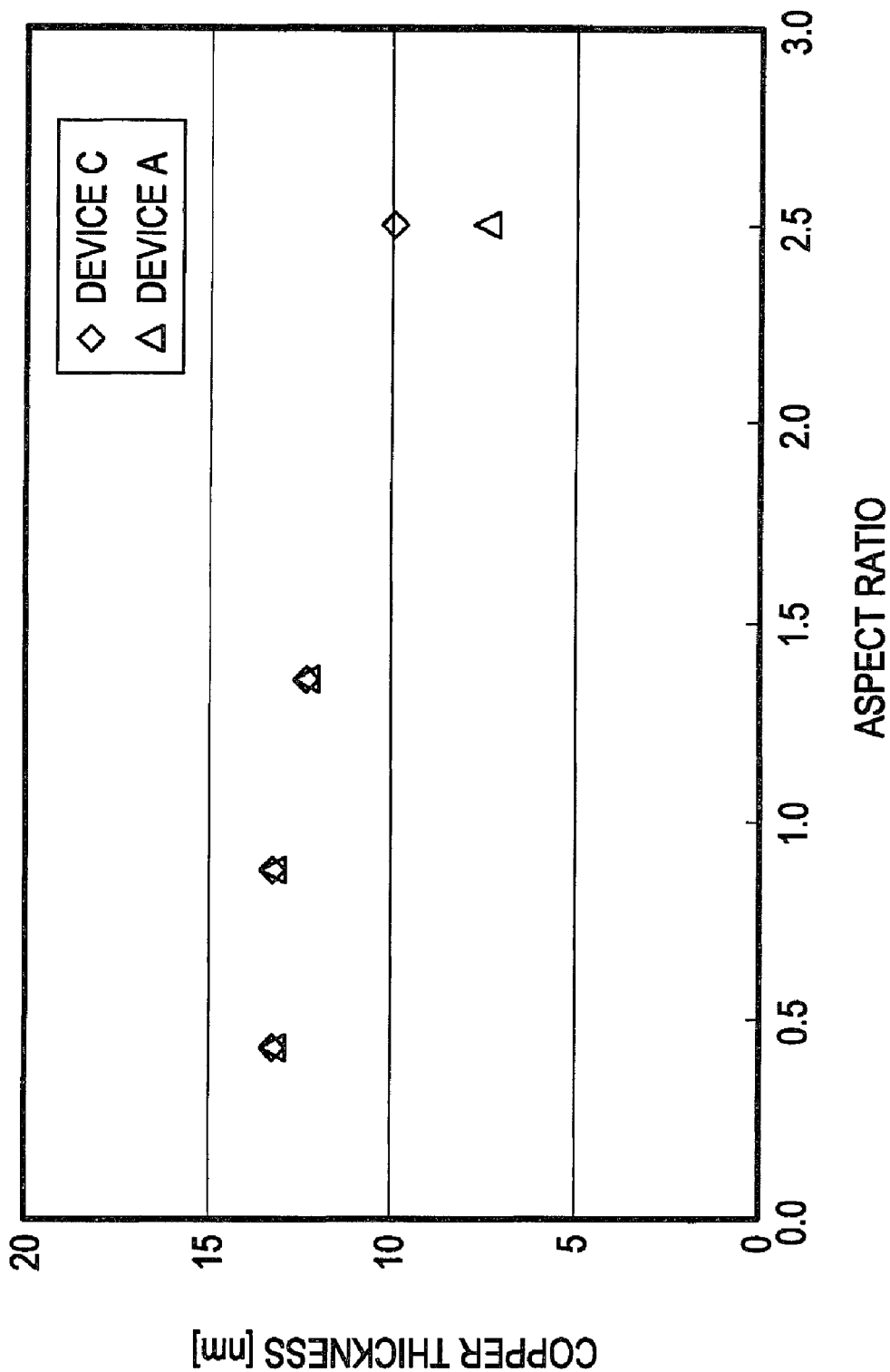
FIG. 10 is a graph showing an aspect ratio of a via hole and thickness of Cu layer.

FIG. 10 is a graph showing the thickness of seed Cu with respect to the aspect ratio of a via hole.

The horizontal axis shows the aspect ratio of the via hole and the vertical axis shows the thickness of a seed Cu film formed at the sidewall of the via hole.

When the aspect ratio of the via hole is 1.5 or less, the thickness of the Cu film was the same in the device A and the device C. If, on the other hand, the aspect ratio of the via hole is 2.5, the thickness of the Cu film was formed thicker in the device C than in the device A. If coverage of the Cu film is poor, voids are generated in the via hole, leading to lower wiring reliability.

Analysis of a via hole section by energy dispersive X-ray (EDX) will be described.

Figure 11A:
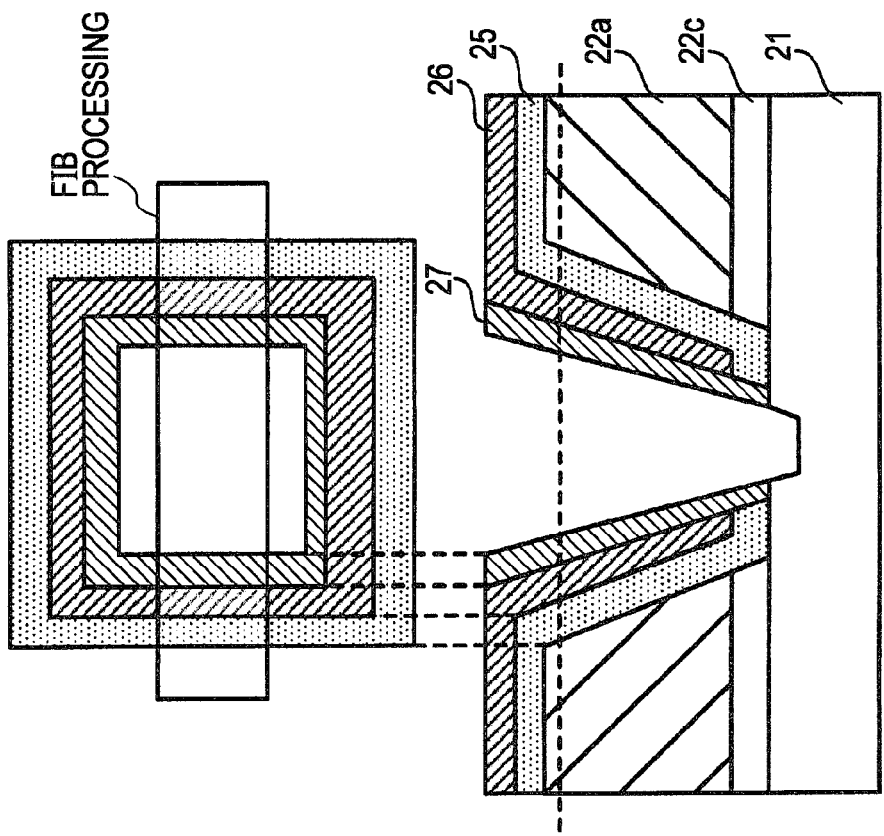
FIGS. 11A and 11B are views of samples for EDX analysis.
Figure 11B:
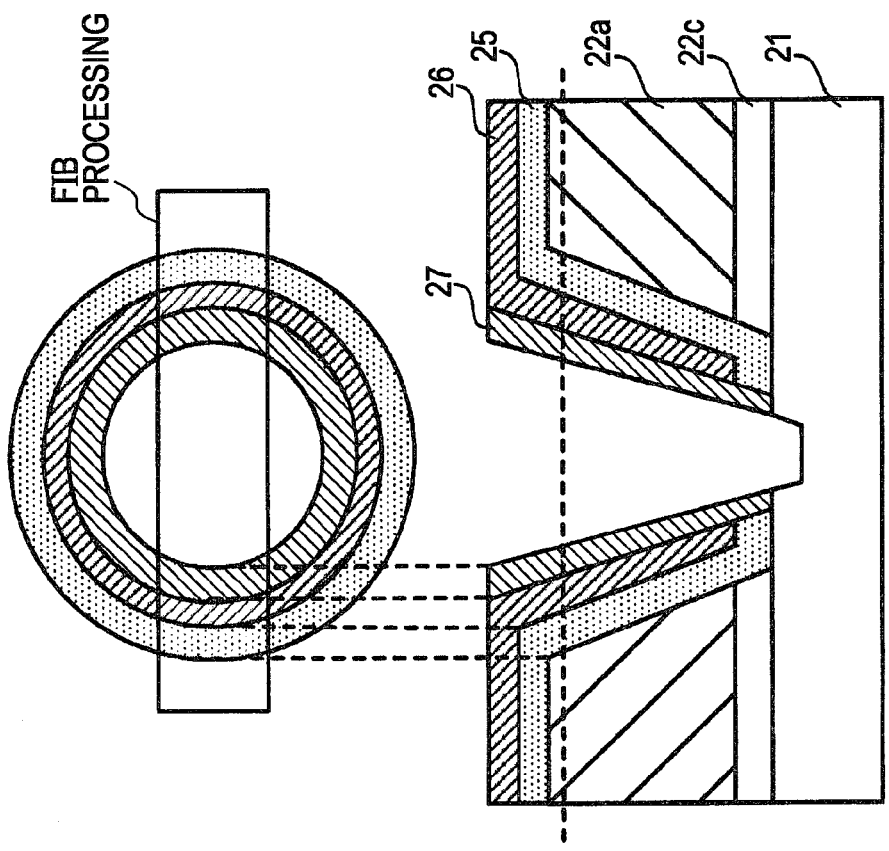

FIGS. 11A and 11B show views of samples of EDX analysis Formation of the seed Cu film 28 and the Cu layer 29 is omitted in FIGS. 11A and 11B.

As shown in FIG. 11A, an opening of a via hole formed in a semiconductor device is generally circular. If, however, focused ion beam (FIB) processing for EDX analysis is performed, interference with observation results is caused by a curvature part of the opening of the via hole. Thus, as shown in FIG. 11B, the shape of the opening was changed to a quadrangular shape here for EDX observation after performing FIB processing. A groove of 70 nm in width was formed in the interlayer dielectric film 22a, 20 nm of the Ti film 25 was formed, and the Ta film 26 was formed over the Ti film 25. The long-throw sputtering process was used for the formation of the Ta film 26 under the conditions of the target power supply of 1 kW to 18 kW, the substrate bias of 0 W, Vd of 1 nm/sec, and Ve of 0 nm/sec so that the thickness of the Ta film 26 became about 3 nm. Then, the Ta film 26 and the Ti film 25 formed at the bottom are etched. Conditions therefor were the target power supply of 1 kW to 5 kW, the substrate bias power of 200 W to 400 W, Vd of the Ta film of 0.7 nm/sec, Ve of 0.9 nm/sec, and the formation time of 40 sec.

Figure 12A:
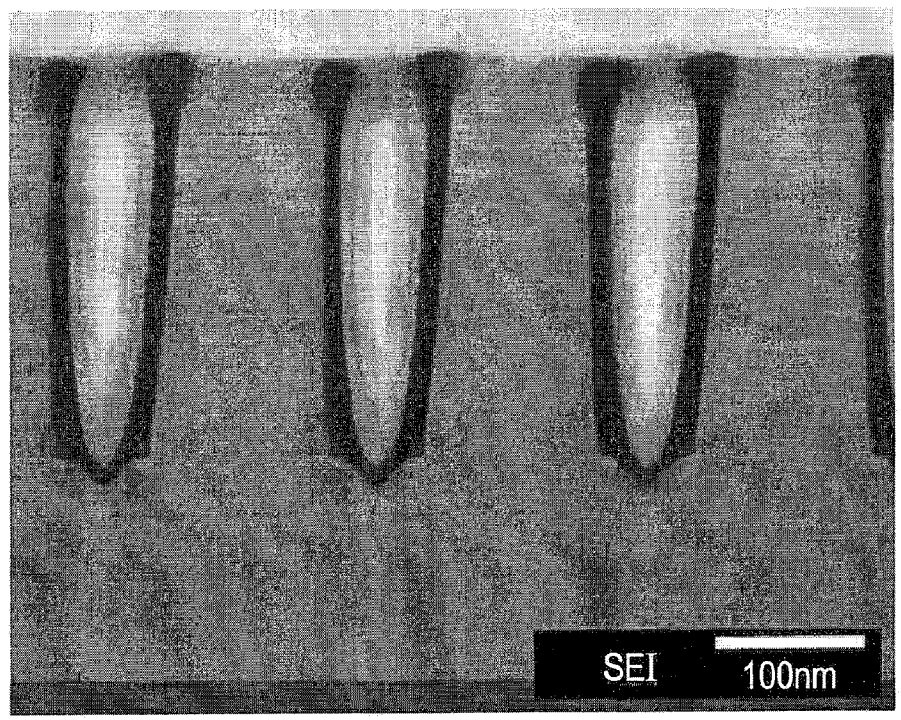
FIGS. 12A and 12B are observation photographs by STEM of a via hole section on which FIB processing is performed.
Figure 12B:
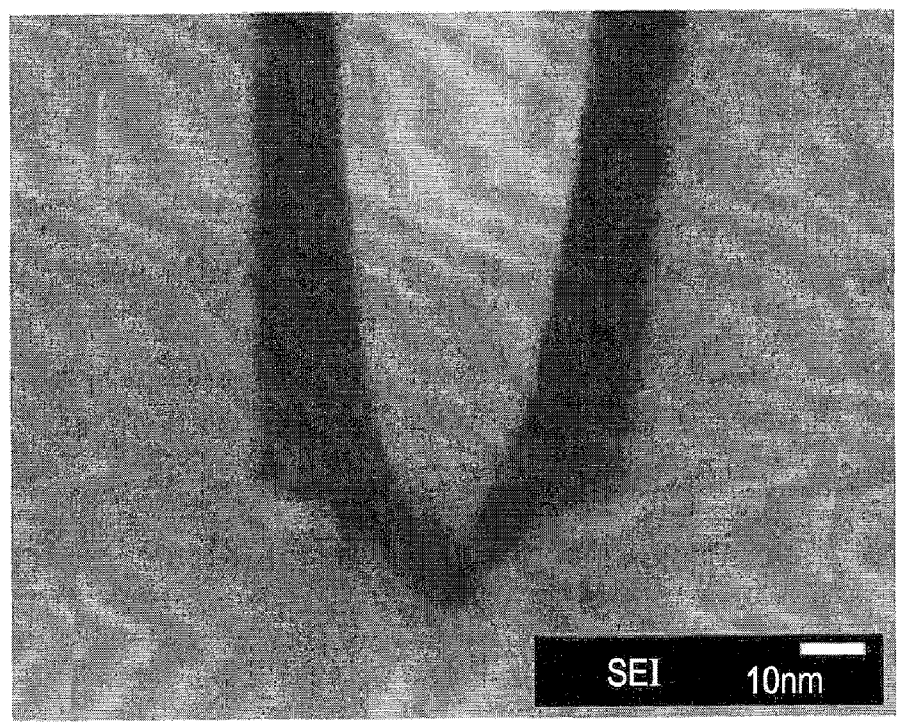

FIGS. 12A and 12B show observation photographs by STEM of a via hole section on which FIB processing is performed.

FIG. 12B is an enlargement of a bottom of FIG. 12A. The bottom of a via hole is etched to a V shape.

FIGS. 13A, 13B and 13C show EDV analysis results in the present embodiment. EDX analysis was performed for the Ti and Ta elements.

FIG. 13A is an enlargement of FIG. 12B. Graphs of the EDV analysis results detailing components of each film are shown. In FIGS. 13B and 13C, the horizontal axis shows the distance from an SOG film for FIB processing protection formed inside the via hole and the vertical axis shows the number counted by a detector of an analyzer, which is a value proportional to the number of target elements. FIG. 13C shows an area of low counts in FIG. 13B.

FIG. 13B shows that a Ti film and a Ta film are laminated over a dielectric film and the Ti—Ta film 27 is present over the Ta film.

In the embodiments, in addition to the Ti element, for example, Zr or Mn, or an alloy of two elements from Ti, Zr, and Mn that have good reactivity with Cu may be used for the Ti film. In addition to the Ta film, for example, W or an alloy of Ta and W having properties of preventing Cu diffusion may be used. Moreover, a similar effect can be obtained from combinations of materials that can constitute the present embodiment.

What is claimed is:

1. A method of manufacturing a semiconductor device, comprising:
    forming a first wiring layer over a semiconductor substrate;
    forming a dielectric film over the first wiring layer;
    forming, in the dielectric film, a first opening and a second opening within the first opening which reaches the first wiring layer;
    forming a first metal film containing a first metal over a surface of the first opening, the second opening, and the dielectric film;
    etching the first metal film at a bottom of the second opening using a sputtering process and forming a second metal film containing a second metal over the surface of the first opening, the second opening, and the dielectric film;
    burying a conductive material in the second opening and the first opening; and
    in said forming the second metal film, a first Vd/Ve at the bottom of the second opening is smaller than a second Vd/Ve at the surface of the dielectric film, where Vd is a deposition rate and Ve is an etching rate.

2. The method according to claim 1, further comprising:
    after forming the first metal film, a third metal film containing the second metal is formed over the surface of the first opening, the second opening, and the dielectric film before forming the second metal film.

3. The method according to claim 1, wherein
    in forming the second metal film, a fourth metal film containing the first metal and the second metal is formed over a sidewall of the second opening.

4. The method according to claim 1, wherein
    any one of argon, helium, and xenon is used as a sputtering gas for formation of the second metal film.

5. The method according to claim 1, wherein
    the first metal includes any one of titanium, zirconium, and manganese, or alloys thereof.

6. The method according to claim 1, wherein
    the second metal includes any one of tantalum and tungsten, or alloys thereof.

7. The method according to claim 1, wherein
    the conductive material includes copper.

8. The method according to claim 7, wherein burying the conductive material comprising:
    forming a seed copper film over the surface of the first opening, the second opening, and the dielectric film; and
    depositing a copper wiring film over the seed copper film using an electroplating method.

9. The method according to claim 8, wherein
    the seed copper film is formed by a sputtering process.

10. The method according to claim 1 further comprising:
    after forming the second metal film, a fifth metal film containing the second metal is formed over the surface of the first opening, the second opening, and the dielectric film by a sputtering process before burying conductive material.

* * * * *